(12) United States Patent
Hiranuma et al.

(10) Patent No.: US 7,745,921 B2
(45) Date of Patent: *Jun. 29, 2010

(54) MULTI-CHIP SEMICONDUCTOR DEVICE

(75) Inventors: Kazuhiko Hiranuma, Sayama (JP);
Hiroshi Kuroda, Akishima (JP);
Yoshiyuki Abe, Takasaki (JP)

(73) Assignee: Renesas Electronics Corp., Tokyo (JP)

( * ) Notice: Subject to any disclaimer, the term of this patent is extended or adjusted under 35 U.S.C. 154(b) by 44 days.

This patent is subject to a terminal disclaimer.

(21) Appl. No.: 12/264,970

(22) Filed: Nov. 5, 2008

(65) Prior Publication Data

US 2009/0065929 A1    Mar. 12, 2009

Related U.S. Application Data

(63) Continuation of application No. 11/392,730, filed on Mar. 30, 2006, now Pat. No. 7,462,929.

(30) Foreign Application Priority Data

Mar. 31, 2005    (JP) .............................. 2005-103012

(51) Int. Cl.
*H01L 23/02* (2006.01)
(52) U.S. Cl. .................. 257/686; 257/724; 257/786; 438/109; 438/110
(58) Field of Classification Search ................. 257/686, 257/724, 777, 786, E25.013, E25.023; 438/109–110
See application file for complete search history.

(56) References Cited

U.S. PATENT DOCUMENTS

| 5,973,403 | A | * | 10/1999 | Wark ........................... 257/777 |
| 6,472,747 | B2 | | 10/2002 | Bazarjani et al. |
| 7,253,511 | B2 | | 8/2007 | Karnezos et al. |
| 7,291,926 | B2 | * | 11/2007 | Tao et al. ..................... 257/777 |
| 2005/0212110 | A1 | | 9/2005 | Kato |

FOREIGN PATENT DOCUMENTS

JP    2004-111656    4/2004
JP    2004-523912    8/2004

* cited by examiner

*Primary Examiner*—Theresa T Doan
(74) *Attorney, Agent, or Firm*—Antonelli, Terry, Stout & Kraus, LLP.

(57) ABSTRACT

A semiconductor device includes semiconductor chips differing in withstand voltage or in noise immunity, such as a multi-chip module. The semiconductor device includes first and second semiconductor chips mounted over a package substrate which has bonding pads arranged along the edges. The first semiconductor chip includes bonding pads for analog signals, and the second semiconductor chip includes bonding pads for high-voltage signals. The edges along which the bonding pads for analog signals are arranged and the edges along which the bonding pads for high-voltage signals are arranged are disposed along mutually different edges of the package substrate. Adjoining of electrodes or wirings for high voltage signals and those for analog signals over the package substrate can be easily avoided, and SI deterioration can be thereby restrained.

8 Claims, 15 Drawing Sheets

MULTI-CHIP SEMICONDUCTOR DEVICE

CROSS REFERENCE TO RELATED APPLICATION

This application is a continuation of U.S. application Ser. No. 11/392,730, filed Mar. 30, 2006 now U.S. Pat. No. 7,462,929 and which application claims priority from Japanese Patent Application No. 2005-103102 filed on Mar. 31, 2005, the entire contents of which are hereby incorporated by reference into this application.

BACKGROUND OF THE INVENTION

The present invention relates to a semiconductor device in which a plurality of semiconductor chips differing in withstand voltage or a plurality of semiconductor differing in chip noise immunity are stacked one over another, such as a multi-chip module (MCM). More particularly, it relates to a technique which can be effectively applied to system-in-package (SIP) semiconductor devices which perform, for instance, analog front end processing for the outputs of charge-coupled devices (CCDs) and pulse driving for CCDs.

Known multi-chip modules in which a plurality of semiconductor chips differing in noise immunity are stacked one over another include one in which individually formed analog chips and digital chips are integrated into a single package is described in Patent Document 1. By separating analog chips and digital chips from each other, the analog circuits are protected from being affected via a common silicon substrate by noise occurring in the digital circuits. The arrangement of the analog chips smaller in chip size over the digital chips contributes to reducing the module size.

Patent Document 2 describes a multi-chip module in which a plurality of semiconductor chips are stacked one over another, over a package substrate. The semiconductor chips are electrically connected to the package substrate via bonding wires. The semiconductor chips arranged in lower layers are wire-bonded to positions away from the edges of the package substrate while those arranged in upper layers are wire-bonded to positions closer to the edges of the package substrate.

Patent Document 1: Japanese Translation of Unexamined PCT application No. 2004-523912

Patent Document 2: Japanese Unexamined Patent Application Laid-Open No. 2004-111656

SUMMARY OF THE INVENTION

The present inventors made a study on a multi-chip module in which a plurality of semiconductor chips differing in withstand voltage or a plurality of semiconductor chips differing in noise immunity are stacked over another, for instance a system-in-package (SIP) semiconductor device which performs analog front end processing for the output of a charge-coupled device (CCD) and pulse driving for the CCD. When the analog front end circuit for processing image sensing signals from the CCD operates on 3 V, high voltage pulses having a plurality of phases have to be used for pulse priding of that CCD in an approximate voltage range of −7 V to 15 V. Therefore, it is necessary to choose different semiconductor processes and separately integrate semiconductor circuits, differing in withstand voltage, for analog front end processing and for pulse driving. It is possible also to mount a digital signal processing circuit for image processing on the semiconductor chip forming the analog front end processing. Over the package substrate to be mounted with the two semiconductor chips, many bonding pads to be wire-bonded to the semiconductor chips are arranged along their edges. Over the rear face of the substrate, many ball electrodes for mounting the multi-chip module over a mother board or the like are arrayed, and wiring the respectively matching bonding pads and ball electrodes is formed. In order to improve signal integrity (SI), it is obviously advisable to keep terminals and wiring for analog signals and those for digital signals as far as practicable from each other. Meeting this requirement, however, often needs consideration of other conditions as well. For instance, a noise filter is often formed by externally fitting passive components, such as an inductor and a capacitor, to a terminal for analog signals. If this arrangement is to satisfy the requirement for simplified wiring structure of the mother board, it is desirable to allocate an outermost ball electrode for that external terminal for analog signals on the array, but this might sometimes invite boosted coupling noise due to increased wiring within the substrate. The present inventors found that, if that deterioration in SI was impermissible, special consideration should be given to the stacking position of chips, arrangement of the bonding pad and the allocation of signals to the bonding pads. It was also revealed that special attention against SI deterioration should be paid to the terminals and wiring for high voltage signals and those for analog signals.

An object of the present invention is to improve SI in a semiconductor device in which a plurality of semiconductor chips differing in withstand voltage or a plurality of semiconductor chips differing in noise immunity, such as a multi-chip module.

This and other objects and novel features of the invention will become more apparent from the description in this specification when taken conjunction with the accompanying drawings.

Typical aspects of the invention disclosed in the present application will be briefly described below.

[1] A semiconductor device comprises a package substrate which has a plurality of electrodes for external connection arrayed over one face and a plurality of bonding pads arranged along the edges of the other face; and a first semiconductor chip 3 and a second semiconductor chip 4 mounted over the other face of the package substrate, stacked one over the other and having a plurality of bonding pads along each edge of the face. The first semiconductor chip has a plurality of bonding pads for analog signals, and the second semiconductor chip has a plurality of bonding pads for high-voltage signals. The edges along which the bonding pads for analog signals are arranged and the edges along which the bonding pads for high-voltage signals are arranged are disposed along mutually different edges of the package substrate.

The device described above has a configuration in which the bonding pads for analog signals are arranged and the edges along which the bonding pads for high-voltage signals are arranged are disposed along mutually different edges of the package substrate. Therefore, adjoining of electrodes or wirings for high voltage signals and those for analog signals over the package substrate can be easily avoided, and SI deterioration due coupling noise or the like can be thereby restrained.

[2] In one typical specific mode of implementing the invention, the first semiconductor chip is arranged over the package substrate and the second semiconductor chip is arranged over the first semiconductor chip. In this configuration, the first bonding pads (7F) of the package substrate to be wire-bonded to the bonding pads (5) of the first semiconductor chip are arranged farther from the edges of the package substrate than the second bonding pads (7S) of the package substrate to be wire-bonded to the bonding pads (6) of the second semiconductor chip. To reduce the wiring length over the package substrate, it is advisable to allocate more of electrodes for external connection, to be connected to the second semiconductor chip, close to edges of the array than the electrodes for external connection, to be connected to the first semiconductor chip. In this way, it can also contribute to improving SI of the semiconductor device in the sense that the wiring length over the package substrate can be reduced.

The package substrate (2) in this configuration has first wirings (L1A and L2A) to connect the first bonding pad (7FA) to be wire-bonded to the bonding pad for analog signals of the first semiconductor chip to an electrode for external connection (25A) arranged outermost on the array. Since the outermost electrode on the array is allocated as the electrode for external connection in this configuration, it is made possible to facilitate simplification of the wiring structure over the mother board even where a noise filter or the like has to be formed by externally fitting passive components such as an inductor and a capacitor to the ball electrode for analog signals.

As described above, when the outermost electrode for external connection on the array is allocated to the bonding pad for analog signals of the first semiconductor chip, it would adjoin a digital wiring, if any, close to the wiring drawn for connection to that electrode for external connection. Or such adjoining may occur as a result of increased threading of wiring from the bonding pad for digital signals, which would have minimize the wiring route length if it were allocated to that ball electrode. Incidentally, for such threading of wiring, a second wiring can be added to connect the second bonding pad to be wire-bonded to the bonding pad for digital signals of the second semiconductor chip to an electrode for external connection arranged inner than the outermost on the array. Where wiring for analog signals adjoins wiring for digital signals, the analog signals may be affected by coupling noise. Then, even if a first wiring for connecting the bonding pads for analog signals to the outermost ball electrode on the array is threaded, all of them will not adjoin the wiring for digital signals. It is advisable to allocate wirings for analog signals less susceptible to the effects of coupling noise, such as wirings for analog signals for testing use, as the wirings for analog signals adjoining the wirings for digital signals. In this way, simplification of the wiring structure over the mother board with consideration for external fitting of circuit components can be facilitated while ensuring the minimization of SI deterioration of analog signals due to coupling with wirings for digital signals. Where another anti-noise means is to be resorted to, top priority can be given to simplification of the wiring structure over the mother board.

[3] In another typical specific mode of implementing the invention, the second semiconductor chip is arranged over the package substrate (2A), and the first semiconductor chip is arranged over the second semiconductor chip. The first bonding pads of the package substrate to be wire-bonded to the bonding pads of the first semiconductor chip are arranged closer to the edges of the package substrate than the second bonding pads of the package substrate to be wire-bonded to the bonding pads of the second semiconductor chip. The package substrate has first wirings (LLA) for connecting the first bonding pads to be wire-bonded to the bonding pads for analog signals of the first semiconductor chip to the electrodes for external connection arranged outermost on the array. The package substrate has second wirings (LLD) for connecting the second bonding pads to be wire-bonded to the bonding pads for digital signals of the second semiconductor chip to the electrodes for external connection arranged inner than the outermost on the array.

In this specific mode of implementing the invention, since the first semiconductor chip is arranged over the second semiconductor chip, allocation of the electrodes for external connection closer to the edges on the array for the bonding of the first semiconductor chip requires no complex wiring over the package substrate. Therefore, electrodes for analog signals for external connection to be connected to the bonding pads for analog signals of the first semiconductor chip automatically come to the outermost on the array. It is made possible to facilitate simplification of the wiring structure over the mother board even where a noise filter or the like has to be formed by externally fitting passive components such as an inductor and a capacitor to the ball electrode for analog signals. There is no restriction to make inevitable for the first and second wirings to adjoin each other, and accordingly the first wiring can be prevented from being affected by coupling the second wiring, thereby facilitating SI improvement.

[4] In still another typical specific mode of implementing the invention, the first semiconductor chip has an A/D converter circuit for converting analog signals inputted to the bonding pads for analog signals into digital signals and a timing generator circuit for generating timing signals. The second semiconductor chip has a driver circuit which inputs the timing signals generated by the timing generator circuit and supplies drive signals from the bonding pads for high-voltage signals.

The semiconductor device, together with an image pickup device and a digital signal processing circuit, can be applied to an image sensing device. The A/D converter circuit of the semiconductor device here converts the image sensing signals supplied from the image pickup device into digital signals and supplies them to the digital signal processing circuit. The driver circuit of the semiconductor device supplies drive signals to the image pickup device. The image pickup device may be a CCD for instance, and the image sensing device may be configured as a digital still camera unit for instance.

[5] A semiconductor device according to another point of view comprises a package substrate which has a plurality of electrodes for external connection arrayed over one face and a plurality of bonding pads arranged along the edges of the other face; a first semiconductor chip mounted over the other face of the package substrate; and a second semiconductor chip disposed over the first semiconductor chip. The first semiconductor chip has along edges a plurality of bonding pads, some of which are a plurality of bonding pads for analog signals. The second semiconductor chip has along edges a plurality of bonding pads, some of which are a plurality of bonding pads for digital signals. The first bonding pads of the package substrate to be connected to the bonding pads of the first semiconductor chip are arranged farther than the edges of the package substrate than second bonding pads of the package substrate to be connected to the bonding pads of the second semiconductor chip. The package substrate has first wirings to connect the first bonding pads, to be connected to the bonding pads for analog signals of the first semiconductor chip, to electrodes for external connection arranged outermost on the array. The package substrate has second wirings to connect the second bonding pads, to be connected to the bonding pads for digital signals of the second semiconductor chip, to electrodes for external connection arranged inner than the outermost on the array.

[6] A semiconductor device according to still another point of view comprises a package substrate which has a plurality of electrodes for external connection arrayed over one face and a plurality of bonding pads arranged along the edges of the other face; a second semiconductor chip mounted over the other face of the package substrate; and a first semiconductor chip disposed over the second semiconductor chip. The first semiconductor chip has along edges a plurality of bonding pads, some of which are a plurality of bonding pads for analog signals. The second semiconductor chip has along edges a plurality of bonding pads, some of which are a plurality of bonding pads for digital signals. The first bonding pads of the package substrate to be connected to the bonding pads of the first semiconductor chip are arranged closer to the edges of the package substrate than second bonding pads of the package substrate to be connected to the bonding pads of the second semiconductor chip. The package substrate has first wirings to connect the first bonding pads, to be connected to the bonding pads for analog signals of the first semiconductor chip, to electrodes for external connection arranged outermost on the array. The package substrate has second wirings to connect the second bonding pads, to be connected to the bonding pads for digital signals of the second semiconductor chip, to electrodes for external connection arranged inner than the outermost on the array.

Advantages that can be achieved according to the typical aspects of the invention disclosed in the present application will be briefly described below.

Thus, SI can be improved in a semiconductor device in which a plurality of semiconductor chips differing in withstand voltage or a plurality of semiconductor chips differing in noise immunity, such as a multi-chip module.

DETAILED DESCRIPTION OF THE PREFERRED EMBODIMENTS

Figure 1:
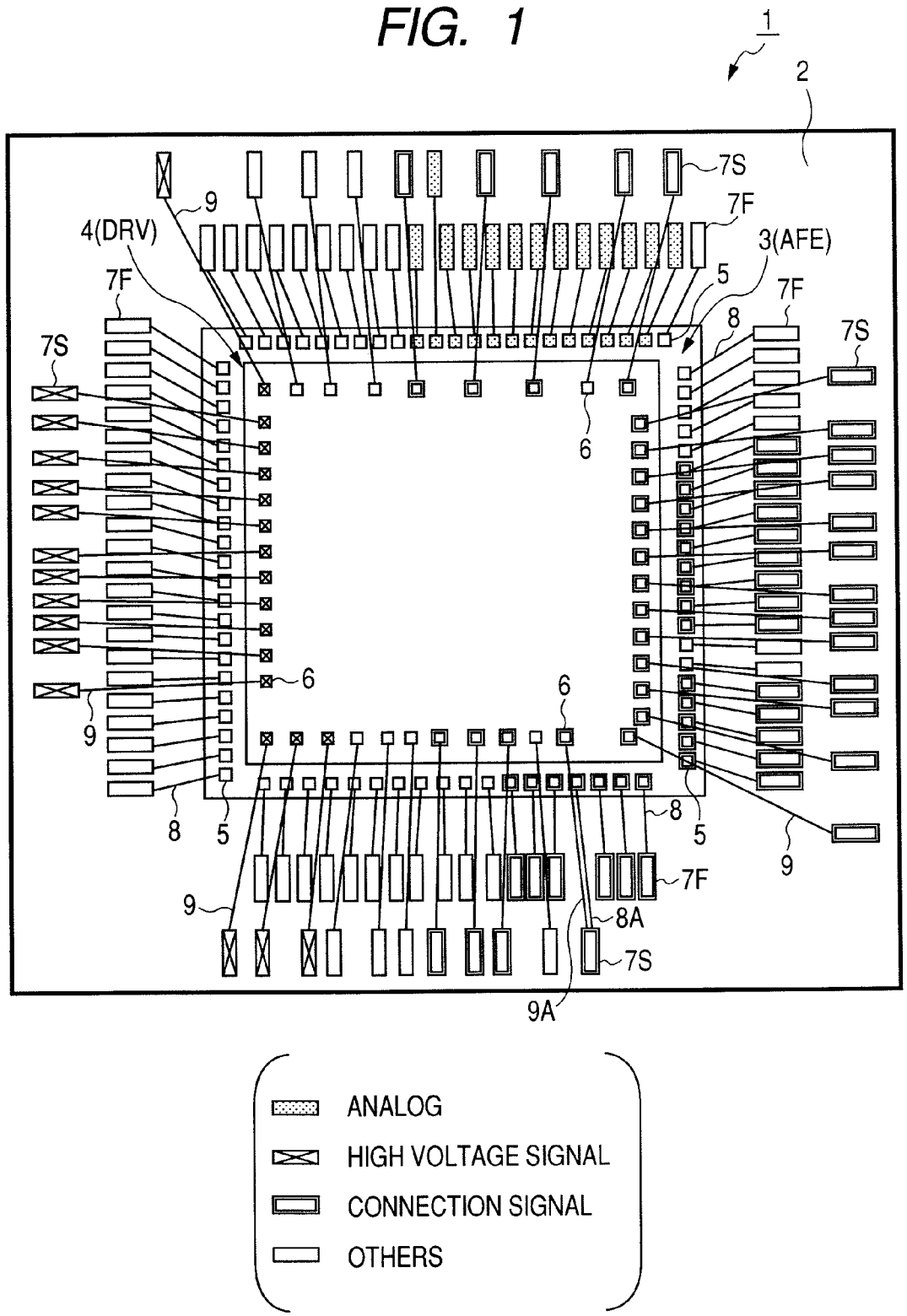
FIG. 1 is a broad plan illustrating a semiconductor device.

FIG. 1 is a broad plan illustrating a semiconductor device. A semiconductor device 1 has a CCD analog front end chip (AFE) 3 as a first semiconductor chip and a CCD driver chip (DRV) 4 as a second semiconductor chip over a package substrate 2. Over the CCD analog front end chip (AFE) 3 bonding pads 5 are arranged in a row along the edge of each side, and over the CCD driver chip (DRV) 4 bonding pads 6 are arranged in a row along the edge of each side. Over the package substrate 2, bonding pads 7 are arranged in two rows along the edge of each side. The second row of the bonding pads 7 (second bonding pads) 7S is arranged closer to an edge of the package substrate 2 than the first row (first bonding pads) 7F. The first bonding pads 7F are bonded to the bonding pads 5 of the CCD analog front end chip 3 by bonding wires 8. The second bonding pads 7S are bonded to the bonding pads 6 of the CCD driver chip 4 by bonding wires 9. As represented by 8A and 9A, there also is a form of commonly connecting the bonding pads 5 of the CCD analog front end chip 3 and the bonding pads 6 of the CCD driver chip 4 to a single bonding pad 7S.

The bonding pads 5, 6 and 7 shown in FIG. 1 are marked with signs and patterns to distinguish their respective main functions. Of the bonding pads 5, 6 and 7, each marked with two large and small quadrilaterals arranged coaxially is a bonding pad for connecting the CCD analog front end chip 3 and the CCD driver chip 4 to each other; each marked with a quadrilateral containing a x sign is a bonding pad for high voltage signals; and each marked with a hatched quadrilateral is a bonding pad for analog signals. Simple quadrilaterals are assigned to all other bonding pads. The bonding pads for high voltage signals are used for outputting drive signals for high voltage pulse driving of the CCD. The bonding pads for analog signals are used for accepting image sensing signals inputted from the CCD. As is evident from FIG. 1, the edge of the CCD analog front end chip 3 along which the bonding pads for analog signals are disposed and the edge of the CCD driver chip 4 along which the bonding pads for high voltage signals are disposed are arranged along mutually different edges of the package substrate 2. This arrangement makes it possible to easily avoid the adjoining of electrodes and wiring for high voltage signals and those for analog signals with each other over the package substrate 2 and thereby to restrain deterioration of SI by coupling noise and other causes.

Figure 2:
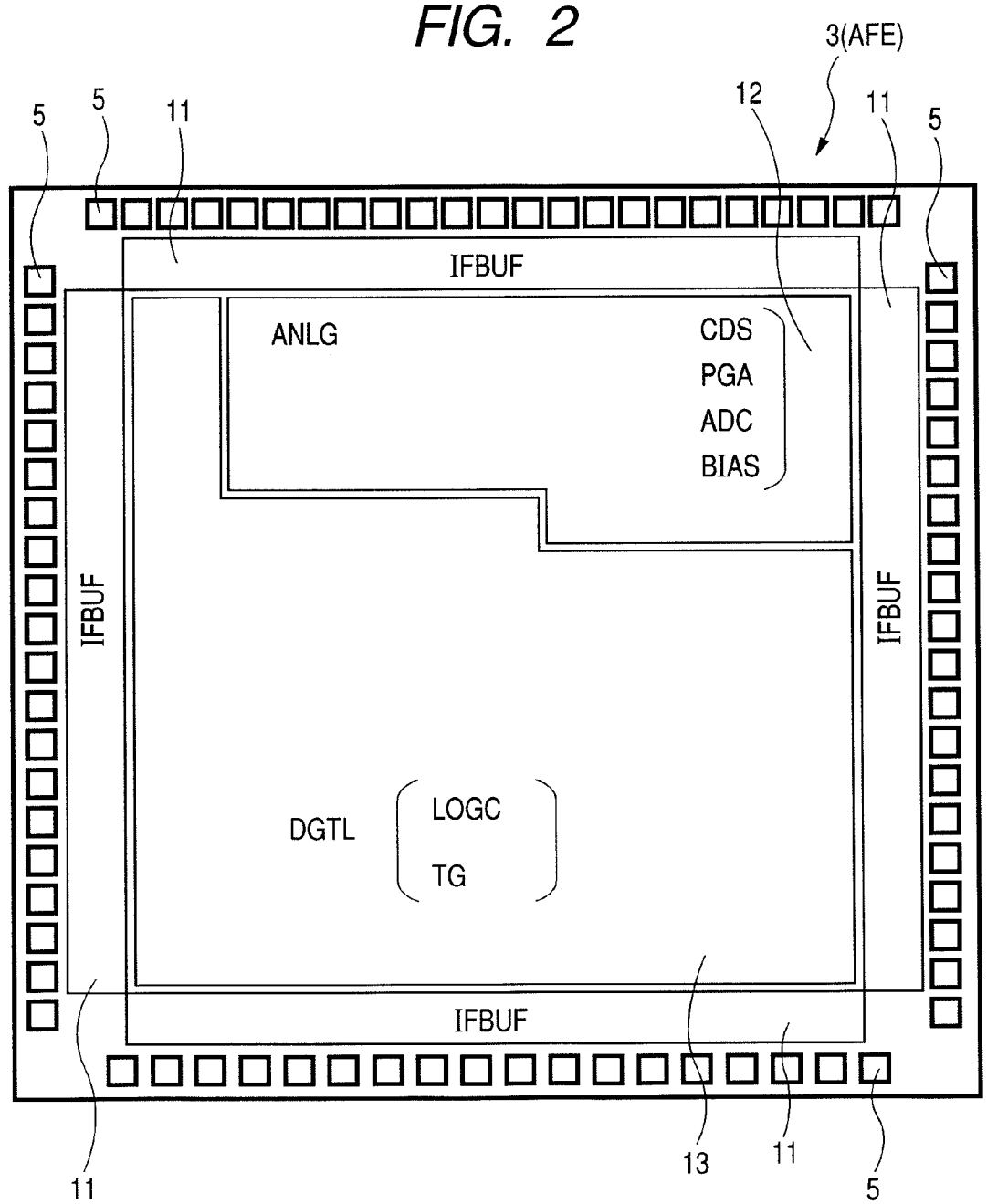
FIG. 2 is a broad plan illustrating a CCD analog front end chip.

FIG. 2 is a broad plan illustrating the CCD analog front end chip 3. Reference numeral 11 denotes an external interface buffer (IFBUF) connected to bonding pads; 12, an analog circuit part (ANLG), and 13, a digital circuit part (DGTL). The analog circuit part has a sampling circuit (CDS) for sampling image sensing signals from the CCD, a programmable gain amplifier (PGA) for amplifying sampled signals, an analog-to-digital converter (ADC) for converting analog signals supplied from the programmable gain amplifier into digital signals, and a biasing circuit (BIAS) for generating a reference voltage for the analog-to-digital conversion among other elements. The digital circuit part has a logic circuit (LOGC) for causing the output of the analog-to-digital converter to be supplied externally and a timing generator (TG) for generating a timing pulse for the operation driving the CCD among other elements. The power supplied for the operation of the CCD analog front end chip 3 is 3 V for instance.

Figure 3:
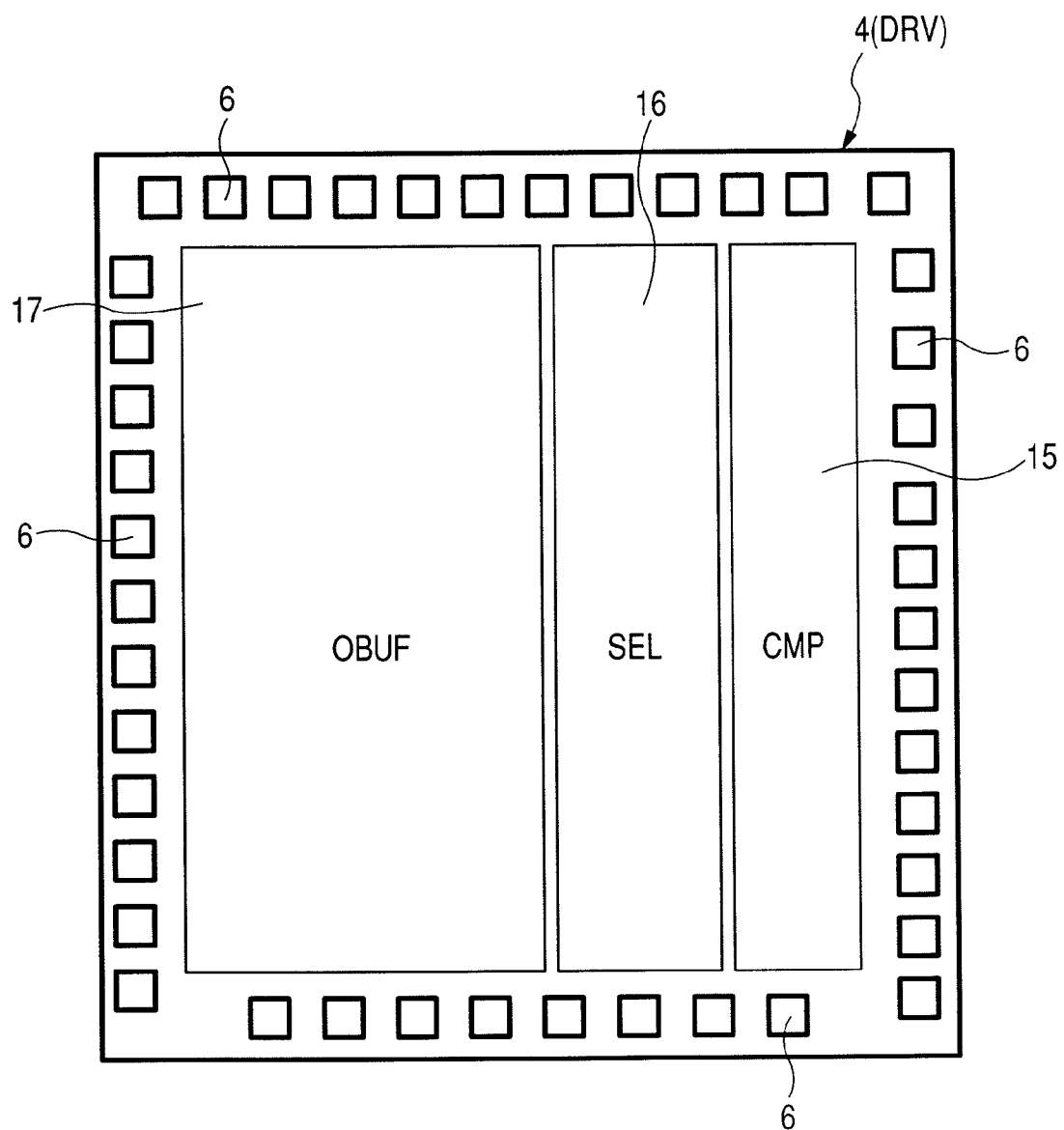
FIG. 3 is a broad plan illustrating a CCD driver chip.

FIG. 3 is a broad plan illustrating the CCD driver chip 4. The CCD driver chip 4 has a comparator (CMP) 15 and a selector (SEL) 16 for receiving a timing pulse signal supplied from the timing generator (TG) and subjecting the amplitude of the timing pulse signal to level conversion to a high voltage, and an output buffer circuit (OBUF) 17 for generating a drive signal for the CCD with the timing pulse signal having undergone the level conversion. The drive signal for the CCD is supposed to be a high voltage pulse of −7 V to 15 V.

Figure 4:
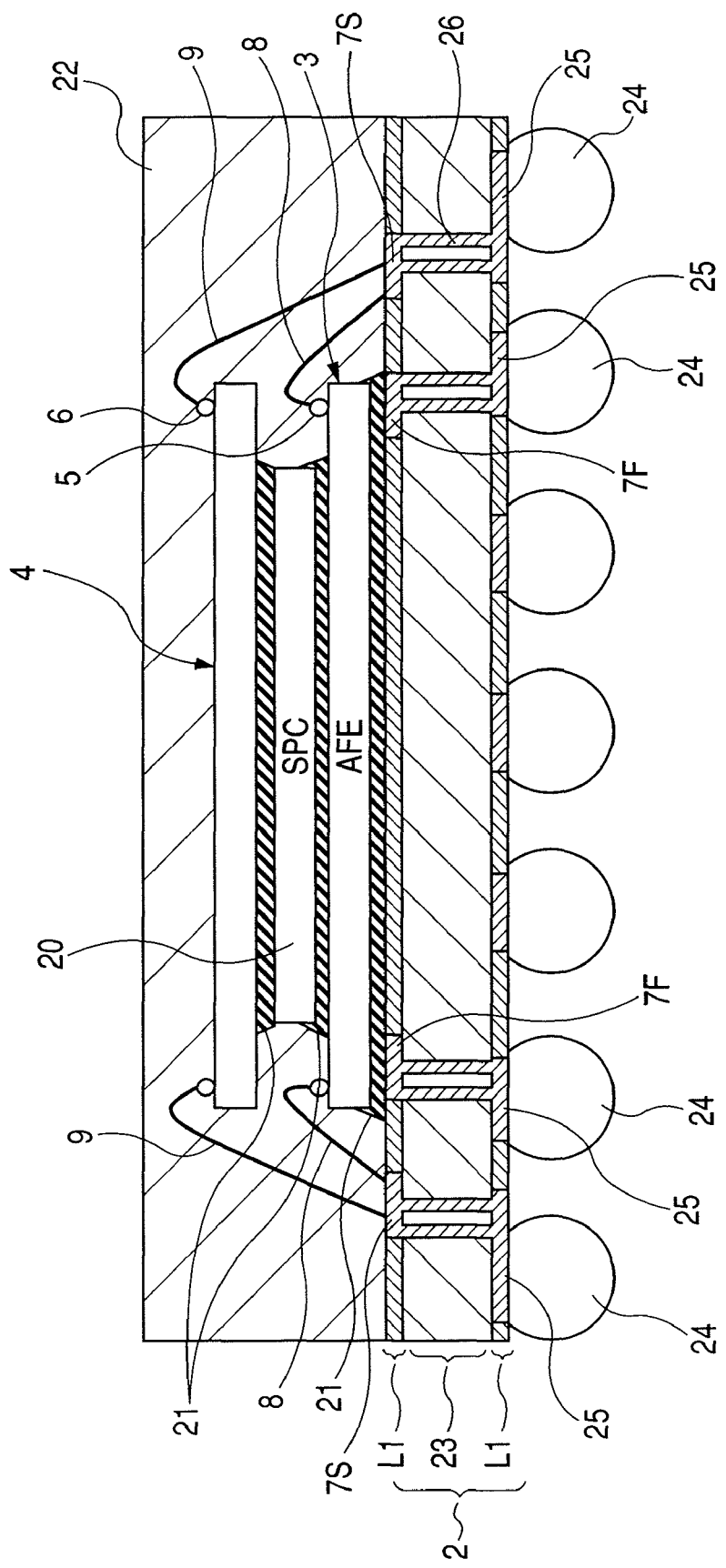
FIG. 4 is a sectional view outlining the vertical sectional structure of the semiconductor device.

FIG. 4 is a sectional view outlining the vertical sectional structure of the semiconductor device 1. Though different from FIG. 1, FIG. 4 shows a case in which the CCD analog front end chip 3 and the CCD driver chip 4 are equal in size. In this case, a spacer (SPC) 20 is arranged between the chips 3 and 4 to secure space for wire bonding. The respective bonding pads 5 and 6 of the chips 3 and 4, though different from the reality, are shown here to be shaped like balls. Reference numeral 21 denotes gaps between the chips 3 and 4 on the one hand and the spacer 20 on the other and an under-fill resin layer between the chip 3 and the mounting substrate; 22 denotes sealing resin.

In the package substrate 2, wiring layers L1 and L2 are formed on the upper and lower sides, respectively, of a core layer 23. An insulating film of solder resist or the like covers the gaps between the wiring patterns in the wiring layers L1 and L2. The bonding pads 7S and 7F are formed over the wiring layer L1. Many ball electrodes 24 to serve as external connection electrodes are arrayed on the under face of the package substrate 2. Lands 25 to be mounted with the ball electrodes 24 are formed over the wiring layer L2. The wiring of the wiring layer L1 and the wiring of the wiring layer L2 to be connected to the bonding pads 7S and 7F are connected to each other by way of vias 26.

Figure 5:
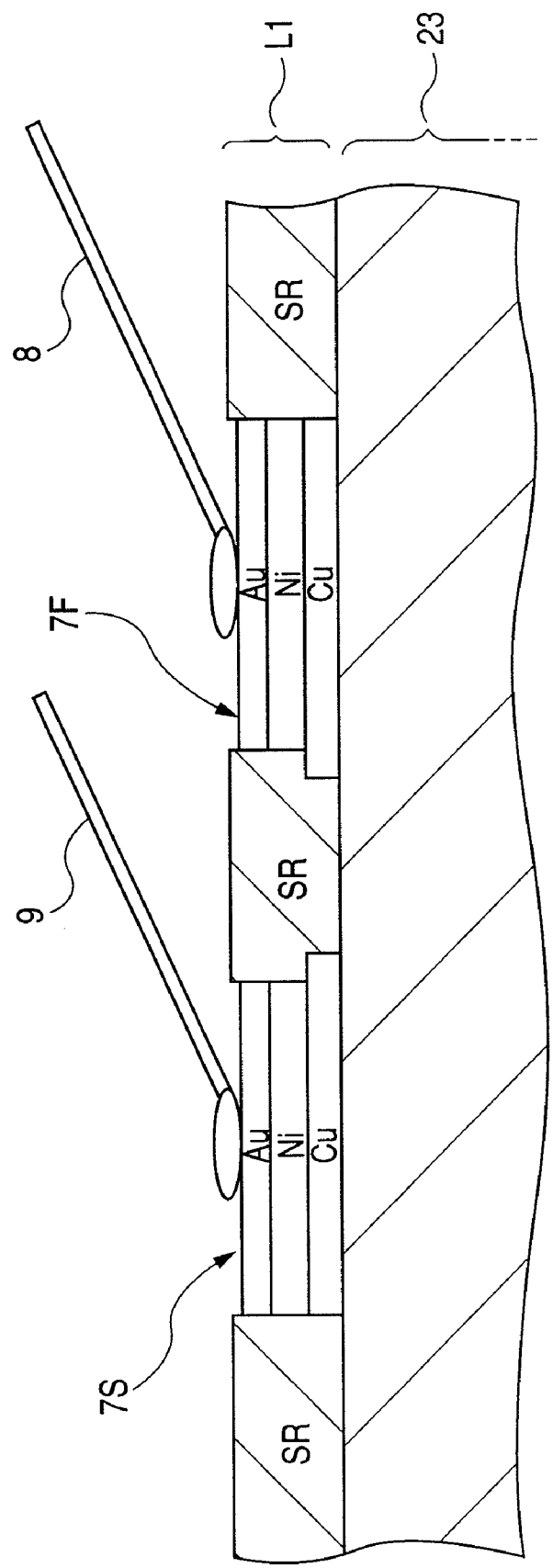
FIG. 5 is a vertical sectional view illustrating specific configurations of bonding pads.

FIG. 5 is a vertical sectional view illustrating specific configurations of the bonding pads 7F and 7S. The bonding pads 7F and 7S are formed by arranging shield pads of nickel (Ni) over copper (Cu) wiring, and pads of gold (Au) over them. The bonding wires 8 and 9 are made of gold. SR is solder resist to serve as an insulating film.

Figure 6:
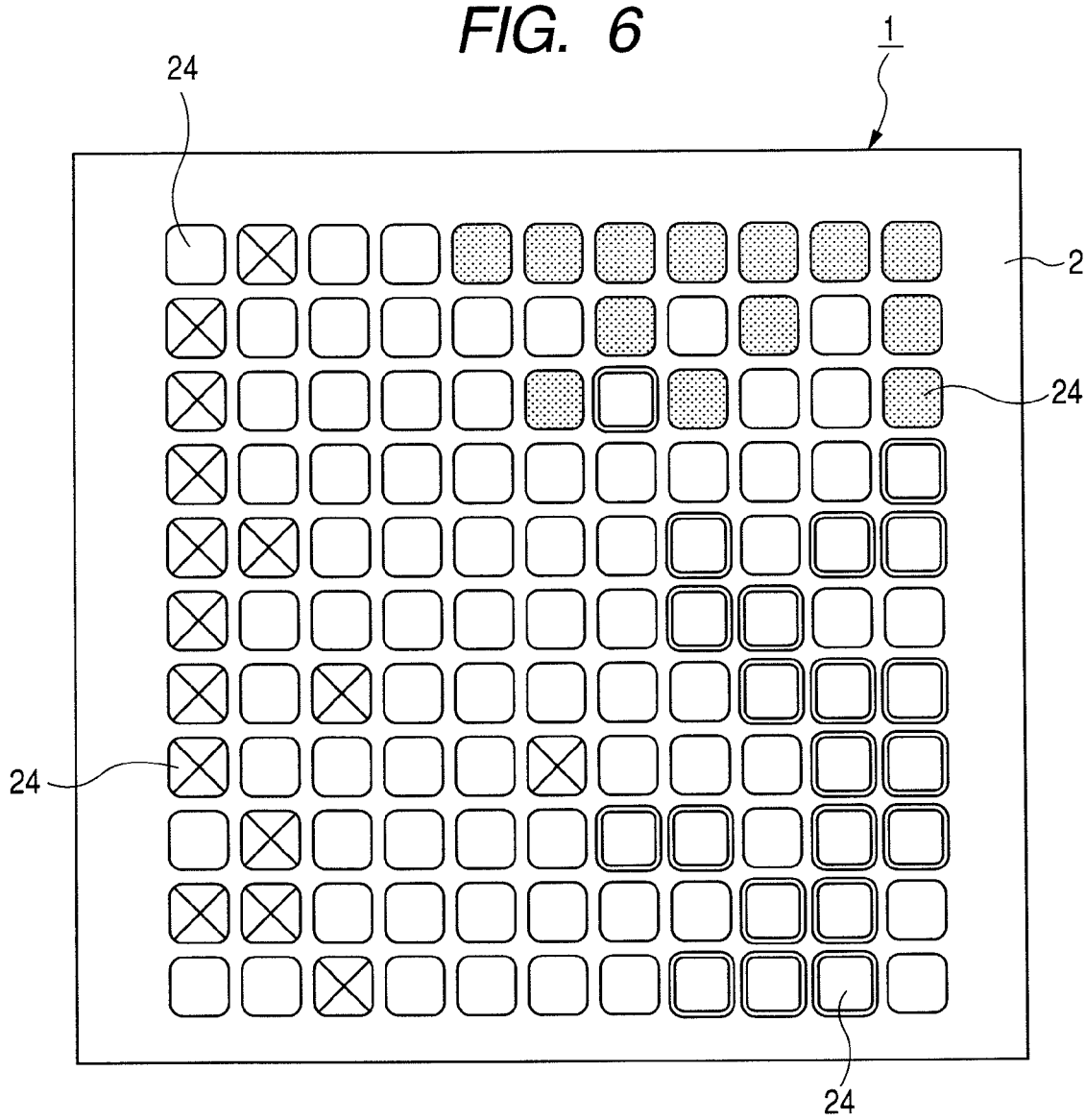
FIG. 6 is a plan illustrating an arrangement of ball electrodes.

FIG. 6 illustrates the arrangement of the ball electrodes 24. In the drawing, the semiconductor device is viewed from above as in FIG. 1. The ball electrodes 24 illustrated here are marked with signs and patterns to distinguish their respective main functions in the same meanings as in FIG. 1. Many ball electrodes 24 are arrayed substantially all over the package substrate 2 except in the central part. As described with reference to FIG. 1, the first bonding pads 7F of the package substrate 2 to be wire-bonded to the bonding pads 5 of the CCD analog front end chip 3 are arranged farther from the edges of the package substrate 2 than the second bonding pads 7S of the package substrate 2 to be wire-bonded to the bonding pads 6 of the CCD driver chip 4. In this arrangement, in order to shorten the wiring layers L1 and L2 over the package substrate 2, more ball electrodes can be allocated as the ball electrodes 24 to be connected to the CCD driver chip 4 closer to the array edges than as the ball electrodes 24 to be connected to the CCD analog front end chip 3. In terms of shortening the wiring in the wiring layers L1 and L2 over the package substrate 2 as well, this arrangement can contribute to SI improvement of the semiconductor device 1. However, as is evident from comparison of FIG. 1 with FIG. 6, while the bonding pads for analog signals are allocated here to the first bonding pads 7F away from the edges of the package substrate 2, the matching ball electrode for analog signals are allocated closer to the edges of the package substrate 2. This reflects consideration for the convenience of externally fitting passive components, such as inductors, to the ball electrodes for analog signals. This point will be described below.

Figure 7:
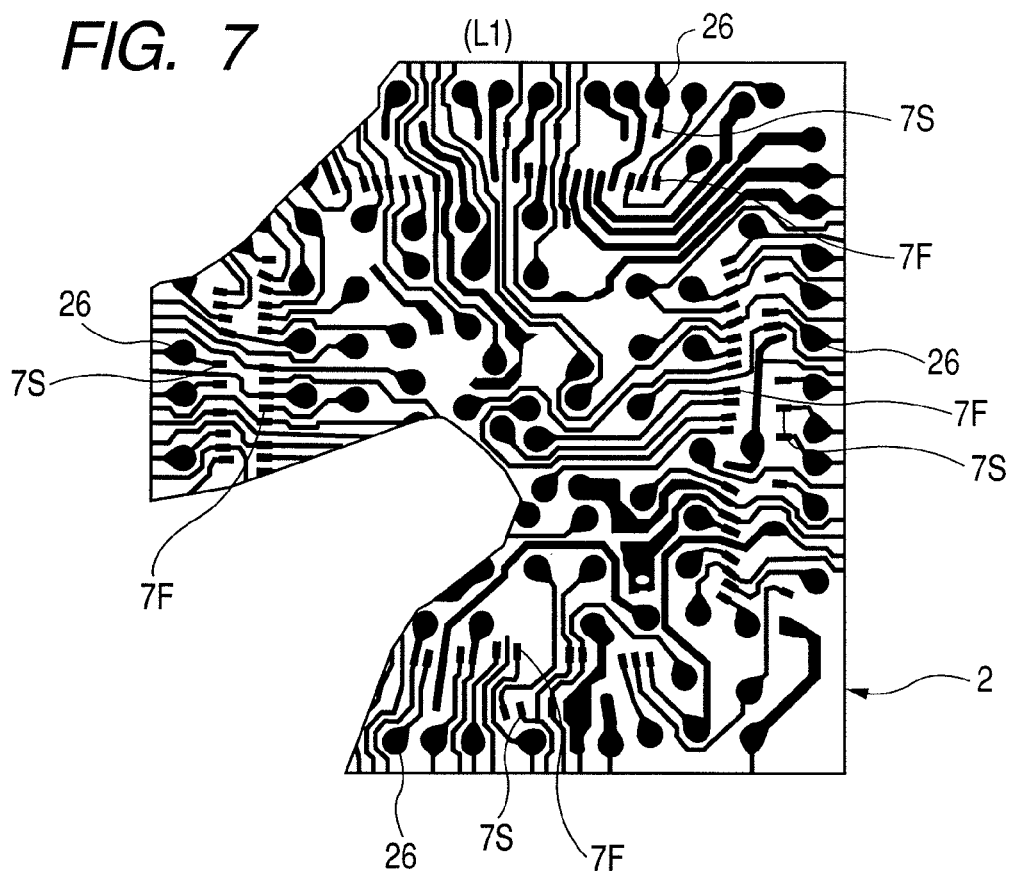
FIG. 7 is a plan illustrating a wiring pattern of a wiring layer L1 of a package substrate.

FIG. 7 illustrates the wiring pattern of the wiring layer L1 of the package substrate. The relatively small quadruples represent the bonding pads 7F and 7S; the round patterns, the vias 26; and other patterns, other elements including the wiring for connecting the bonding pads.

Figure 8:
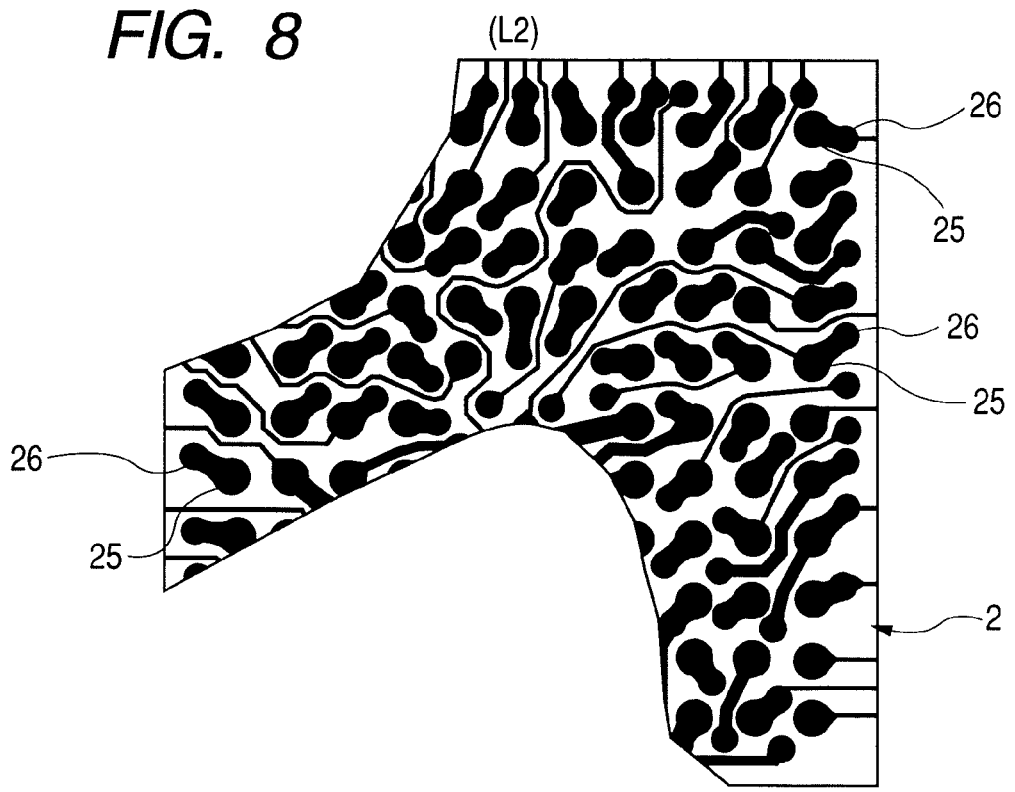
FIG. 8 is a plan illustrating a wiring pattern of a wiring layer L2 of the package substrate.

FIG. 8 illustrates the wiring pattern of the wiring layer L2 of the package substrate. The relatively small round patterns represent the vias 26; relatively large round patterns, the lands 25 of the ball electrodes 24; and other patterns, other elements including the wiring for connecting the bonding pads to the lands of the ball electrodes.

Figure 9:
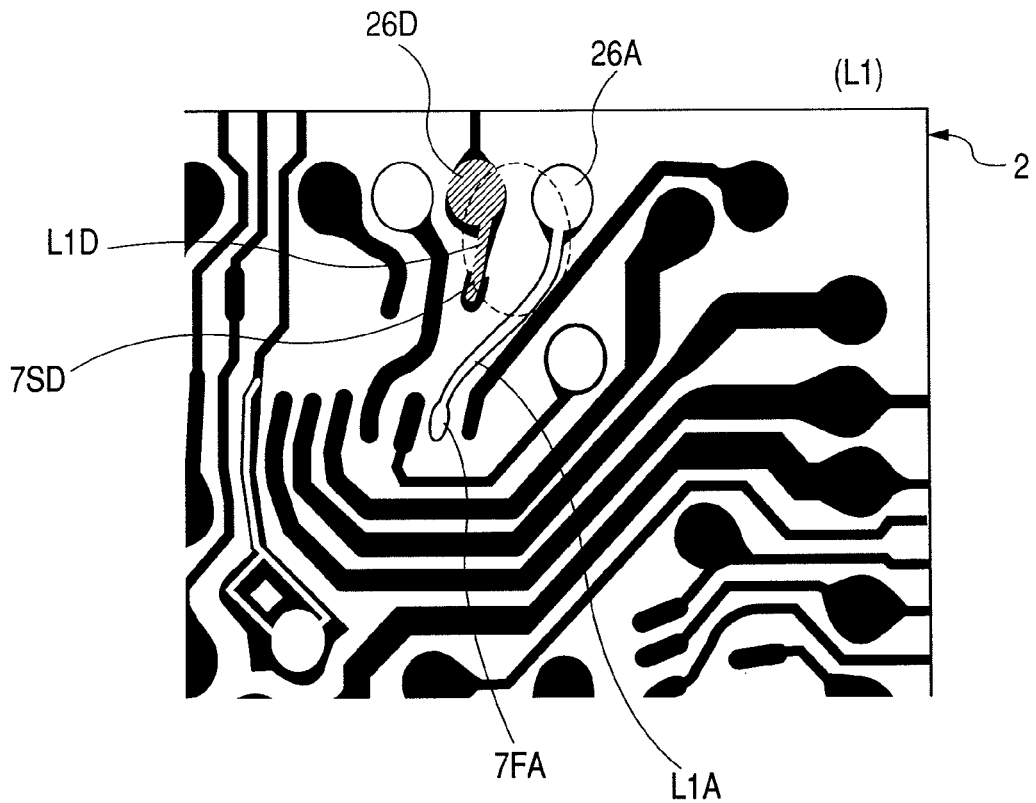
FIG. 9 is a plan illustrating the wiring of the wiring layer L1 for connecting a bonding pad for analog signals to the ball electrode outermost on an edge of the package substrate.
Figure 10:
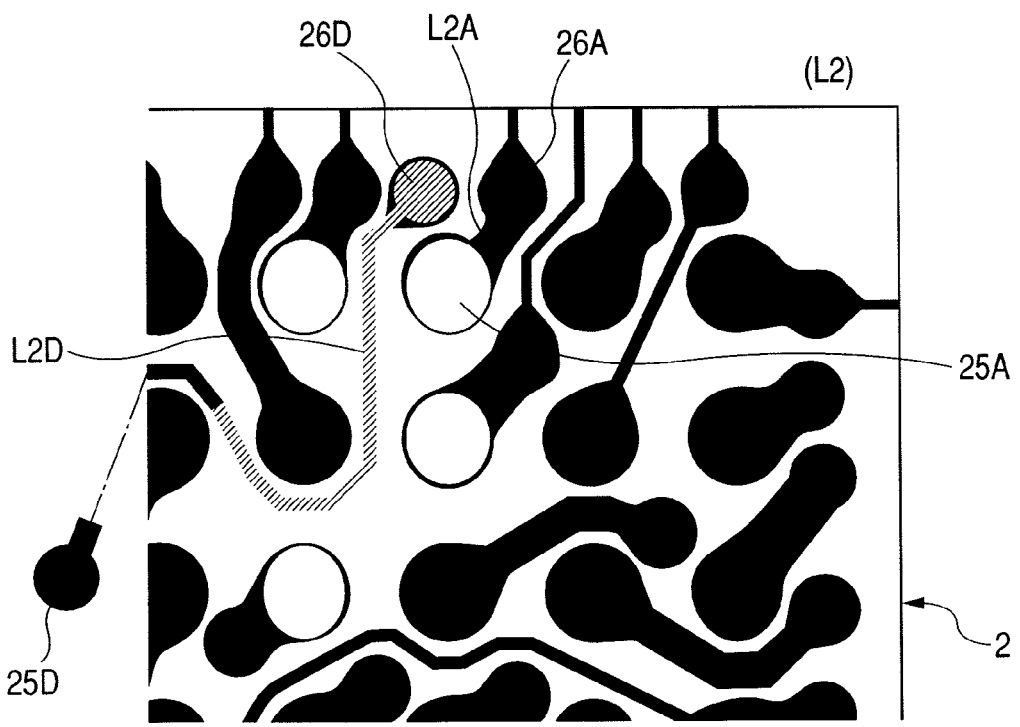
FIG. 10 is a plan illustrating the wiring of the wiring layer L2 for connecting bonding pads for analog signals to ball electrodes outermost on an edge of the package substrate.

FIG. 9 illustrates wiring in the wiring layer L1 for connecting a bonding pad for analog signals to the ball electrode outermost on an edge of the package substrate 2. FIG. 10 illustrates the wiring of the wiring layer L2 for connecting bonding pads for analog signals to ball electrodes outermost on an edge of the package substrate 2.

In FIG. 9, 7FA denotes one of the first bonding pads 7F to be wire-bonded to the bonding pads for analog signals of the analog front end chip 3. This bonding pad 7FA is connected to a via 26A by way of a wire L1A of the wiring layer L1. In FIG. 10, the via 26A is connected to a ball electrode 25A by way of a wire L2A of the wiring layer L2. The ball electrode 25A is one of the outermost arranged ones of the arrayed ball electrodes. By allocating the outermost electrode to the ball electrode for analog signals in this way, it is made possible to facilitate simplification of the wiring structure over the mother board even where a noise filter or the like has to be formed by externally fitting passive components such as an inductor and a capacitor to the ball electrode for analog signals.

In FIG. 9, 7SD denotes one of the second bonding pads 7S to be wire-bonded to the bonding pads for digital signals of the driver chip 4. In particular, it is arranged adjacent to the bonding pad 7FA for analog signals. This bonding pad 7SD is connected to a via 26D by way of a wire L1D of the wiring layer L1. In FIG. 10, the via 26D is connected to a ball electrode 25D by way of a wire L2D of the wiring layer L2. The ball electrode 25D is one of those positioned inner than the outermost arranged ones of the arrayed ball electrodes.

Figure 11:
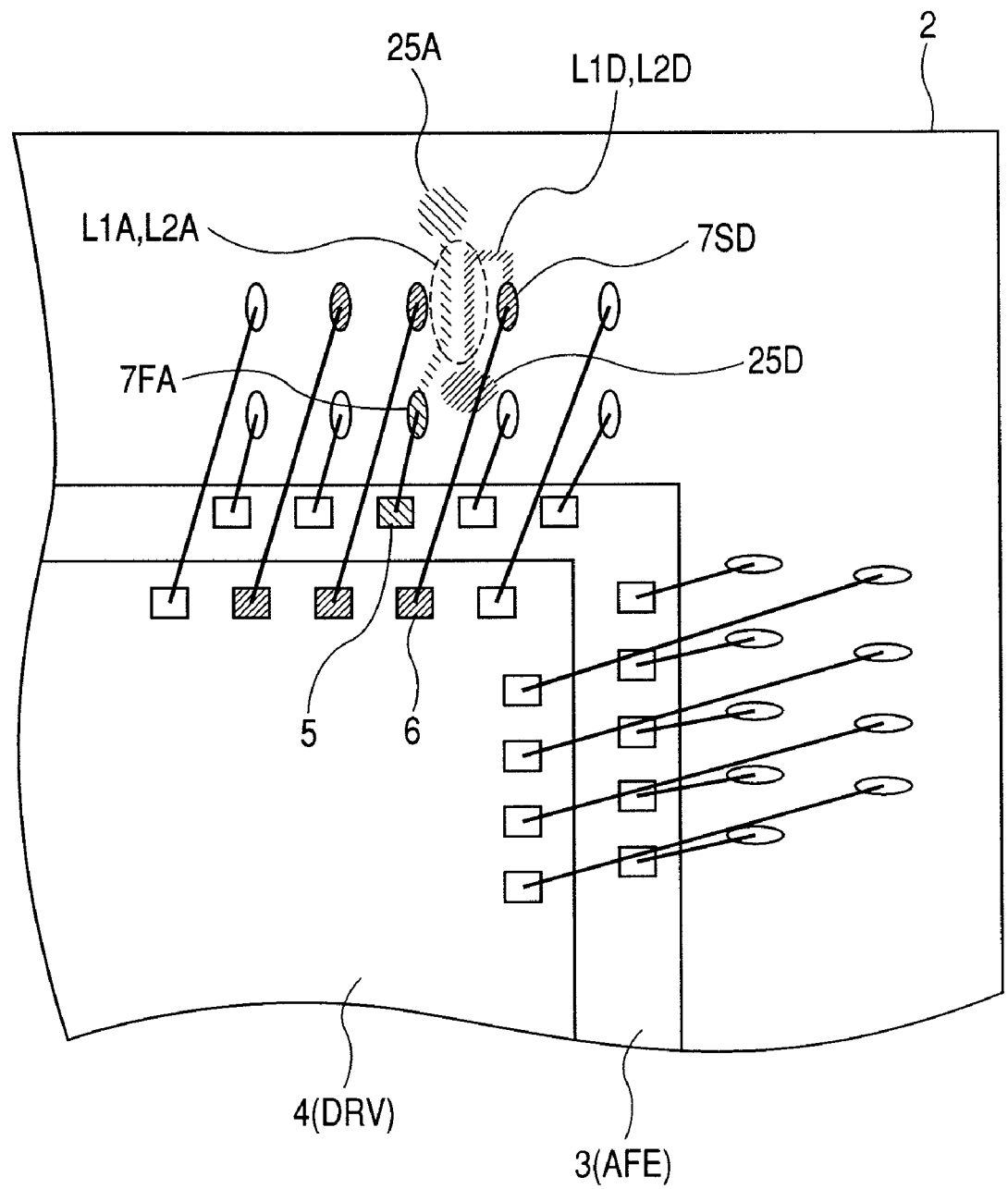
FIG. 11 is a plan schematically illustrating how analog wires L1A and L2A adjoin digital wires L1D and L2D.

The wire L1A for analog signals adjoins the wire L1D for digital signals, and the wire L2A for analog signals the wire L2D for digital signals. This results from threading the wiring for connecting the inner bonding pad 7FA for analog signals to the outermost ball electrode 25A of the array. Adjacency may occur if there is wiring for digital signals nearby and as a result of an increase in the threading of wiring from a bonding pad for digital signals whose allocation to that ball electrode 25A could have minimized the length of the wiring route. FIG. 11 schematically illustrates how analog the wires L1A and L2A for analog signals adjoin the wires L1D and L2D for digital signals.

If the wires L1A and L2A for analog signals adjoin the wires L1D and L2D for digital signals, the analog signals may be affected by coupling noise. Even if wirings for connecting inner bonding pads for analog signals to the outermost ball electrodes of the array, all of them do not adjoin wirings for digital signals. It is advisable to allocate wirings for analog signals less susceptible to the effects of coupling noise as the wirings for analog signals adjoining the wirings for digital signals. Wirings for analog signals for testing use can be allocated for this purpose, for instance. In this way, simplification of the wiring structure over the mother board with consideration for external fitting of circuit components can be facilitated while ensuring the minimization of SI deterioration of analog signals due to coupling with wirings for digital signals. Where another anti-noise means is to be resorted to, top priority can be given to simplification of the wiring structure over the mother board.

Figure 12:
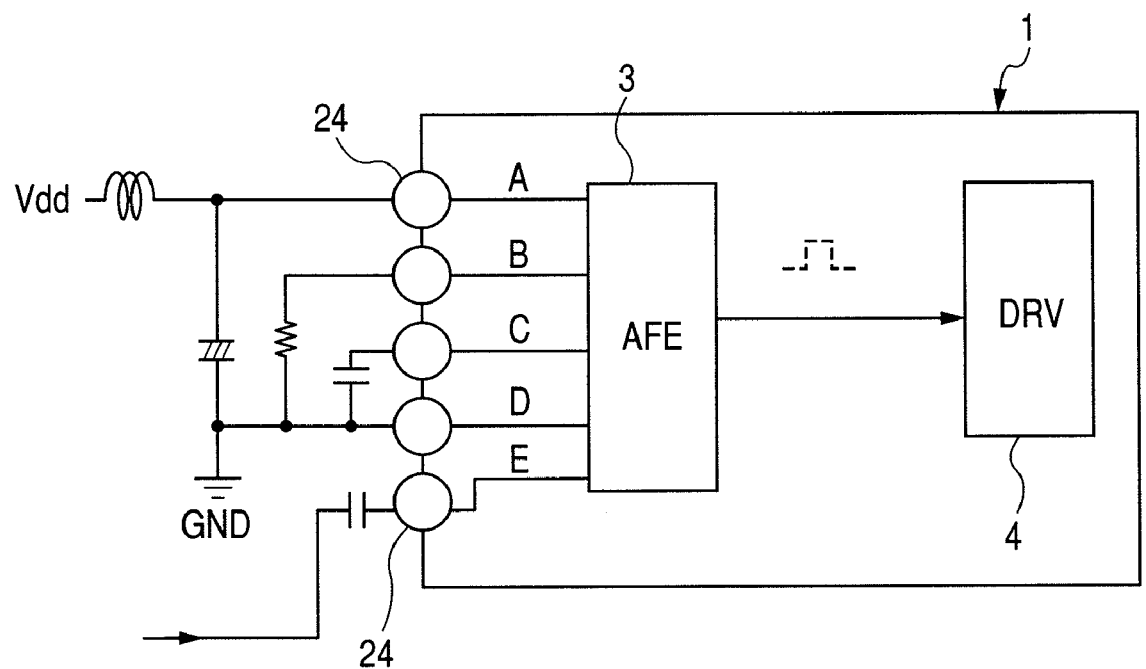
FIG. 12 is a circuit diagram showing one example of analog signal necessitating external fitting of passive components.
Figure 13:
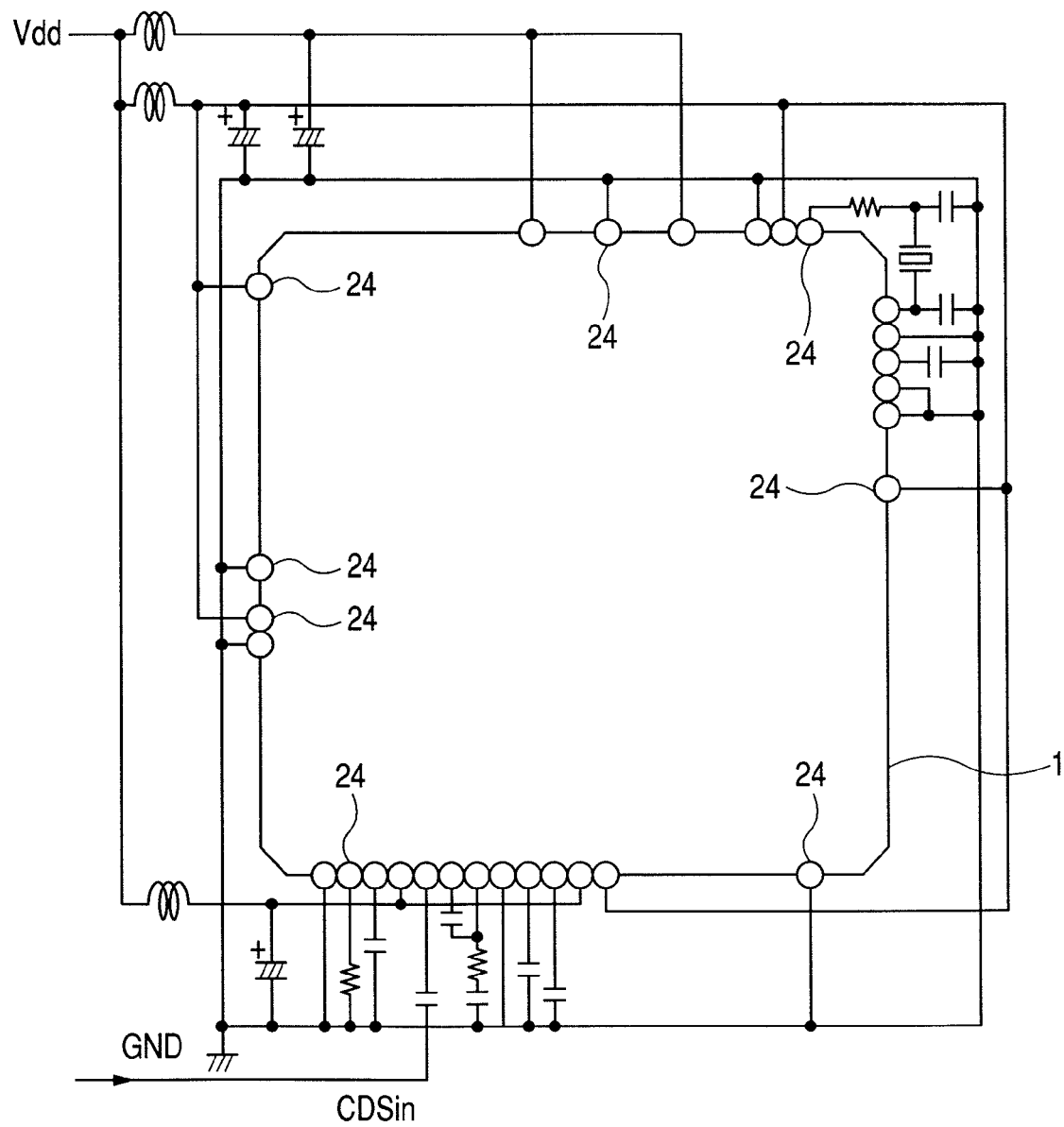
FIG. 13 is a circuit diagram showing one example of external circuit comprising passive components to be connected to the ball electrodes of FIG. 12.

FIG. 12 shows one example of analog signal necessitating external fitting of passive components. Reference sign A denotes the analog power voltage of the analog circuit part 12; D, the analog ground of the analog circuit part 12; B, the reference potential for use by the analog-to-digital converter circuit (ADC); E, an image sensing signal supplied from the CCD; and C, a test signal. Passive components including inductors, capacitors and resistors are externally fitted to the ball electrodes 24 which receive these signals to constitute a noise filter. In FIG. 12, it is desirable especially to keep the image sensing signal E and the reference potential B from the influence of coupling noise. FIG. 13 shows one example of external circuit comprising passive components to be connected to the ball electrodes 24 of FIG. 12. Since a relatively large number of passive components are predictably fitted externally to ball electrode for analog signals as shown in FIG. 13, it is essential for a set manufacturer using the semiconductor device 1 not to make complex the wiring structure over the mother board even when addressing the needs of external fitting of circuit components.

Figure 14:
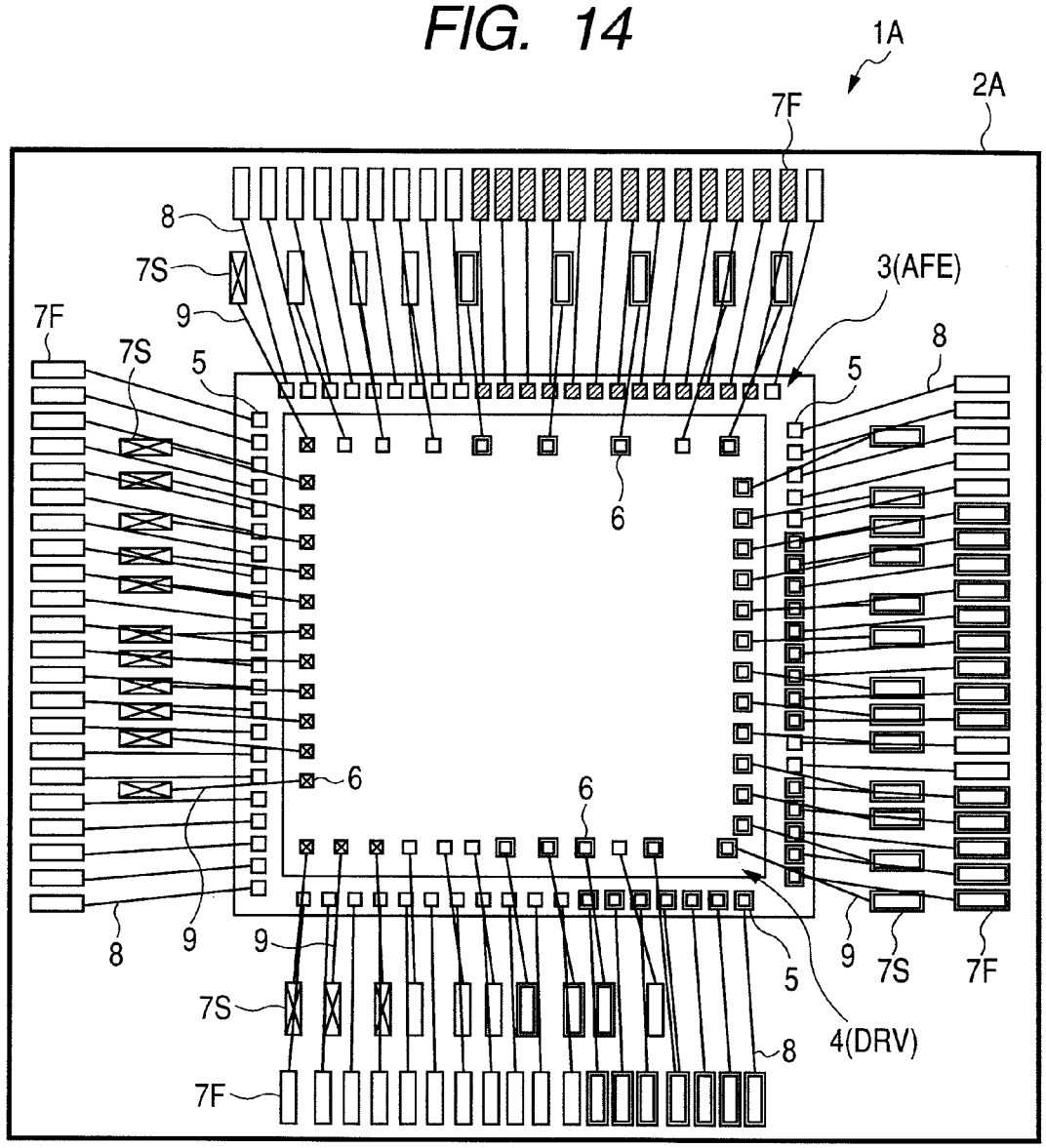
FIG. 14 is a plan schematically illustrating another example of semiconductor device.
Figure 14:
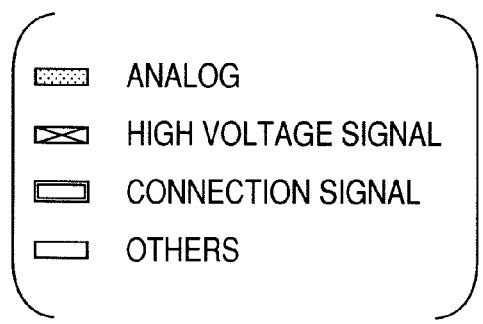

FIG. 14 schematically illustrates another example of semiconductor device. A semiconductor device 1A shown therein is mounted with a CCD driver chip 4 over a package substrate 2A and an analog front end chip 3 over a CCD driver chip 4. Though the outer shape of DRV 4 above is shown in FIG. 14 to be greater than that of AFE 3 below, this difference in apparent size is only for the convenience of drawing, but has no particular significance. Because of the reversed sequence of stacking the two chips, the first bonding pads 7F of the package substrate to be wire-bonded to the bonding pads of the CCD analog front end chip 3 are arranged closer to the edges of the package substrate 2A than the second bonding pads 7S of the package substrate 2A to be wire-bonded to the bonding pads of the CCD driver chip 4. The differences in shape and pattern of the illustrated bonding pads are the same as their respective counterparts in FIG. 1. Since other aspects of the configuration are the same as in FIG. 1, their detailed description will be dispensed with.

Figure 15:
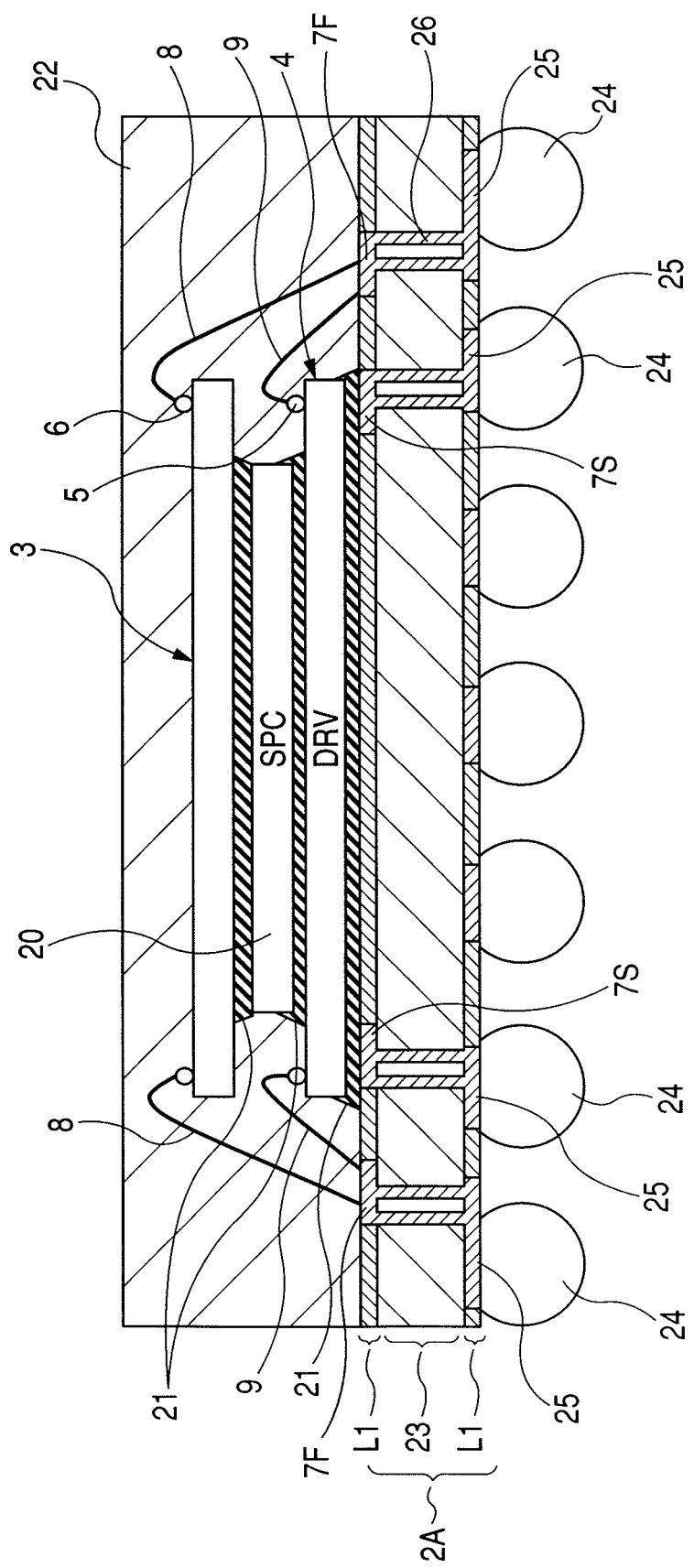
FIG. 15 is a sectional view outlining the vertical sectional structure of the semiconductor device of FIG. 14.

FIG. 15 shows the vertical sectional structure of the semiconductor device 1A. The differences from the structure shown in FIG. 4 are the reverse stacking sequence of AFE 3 and DRV 4 and the resultant reversed arrangement of the first bonding pads 7F and the second bonding pads between in and out. Since other aspects of the configuration are the same as in FIG. 4, their detailed description will be dispensed with.

Figure 16:
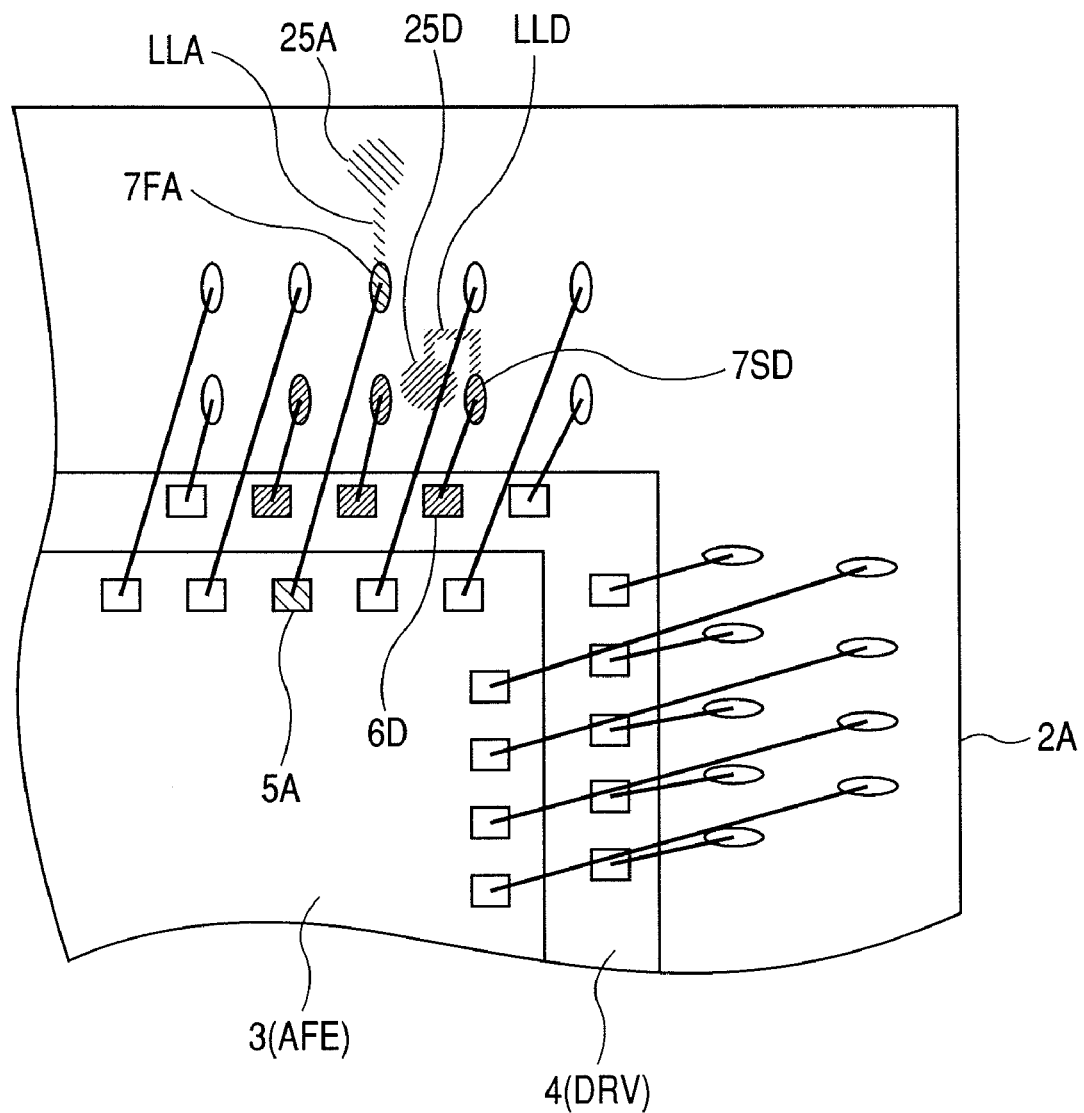
FIG. 16 is a plan schematically illustrating the state of analog wiring and digital wiring over the package substrate of the semiconductor device of FIG. 14.

FIG. 16 schematically illustrates the state of analog wiring and digital wiring over the package substrate 2A. The package substrate 2A has a wiring LLA for connecting the first bonding pad 7FA, to be wire-bonded to the bonding pad 5A for analog signals of the AFE chip 3, to the ball electrode 25A arranged outermost on the array. The package substrate 2A has a wiring LLD for connecting the second bonding pad 7SD, to be wire-bonded to the bonding pad 6D for digital signals of the DRV chip 4, to the ball electrode 25D arranged inner than the outermost on the array. The wirings LLA and LLD means the wiring routes formed of the wiring of the wiring layer L1, the vias 26 and the wiring of the wiring layer L2 of the package substrate 2A.

Since AFE 3 is arranged above DRV 4 in the semiconductor device 1A, no complex wiring needs to be formed over the package substrate 2A to allocate the ball electrodes 25 near the edges on the array for the bonding of AFE 3. Therefore, the ball electrode 25A for analog signals to which the bonding pads 5A for analog signals of AFE 3 are to be connected automatically comes to the outermost on the array. Even where a noise filter or the like has to be formed by externally fitting passive components such as an inductor and a capacitor to the ball electrode 25A for analog signals, simplification of the wiring structure over the mother board can be facilitated. As illustrated in FIG. 16, even if the bonding pad 7FA for analog signals and the bonding pad 7SD digital signals are closed to each other, there is no restriction to make inevitable for the wiring LLA for analog signals and the wiring LLD for digital signals to adjoin each other. The wiring LLA for analog signals and the wiring LLD for digital signals can be prevented from being affected by coupling, and SI improvement is thereby facilitated.

Figure 17:
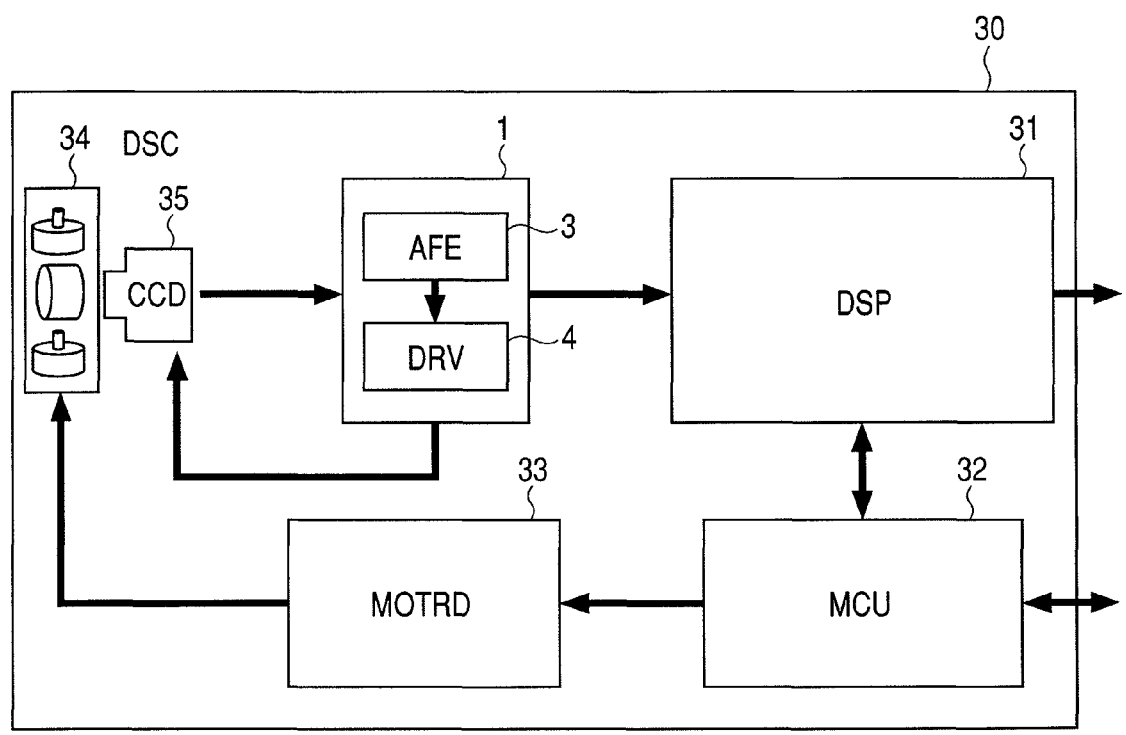
FIG. 17 is a block diagram illustrating a digital still camera unit to which a semiconductor device is applied.

FIG. 17 is a block diagram illustrating a digital still camera unit to which the semiconductor device 1 is applied. A digital still camera unit (DSC) 30 as the image sensing device has the semiconductor device 1, a digital signal processing circuit (DSP) 31, a microcomputer (MCU) 32, a motor driver (MOTRD) 33, an optical system 34 and a CCD 35 as the image sensing device. AFE 3 has the configuration described with reference to FIG. 2. It samples image sensing signals from the CCD 35, amplifies the sampled signals, and converts them into digital signals. The converted digital data undergo feature extraction and necessary correction by the digital signal processing circuit 31, and are displayed or stored as recorded data. AFE 3 generates timing pulses for driving the CCD 35. DRV 4 receives the timing pulses, and subjects the CCD to high voltage pulse driving. The microcomputer 32 controls the optical system 34 and the whole digital still camera unit 30. This digital still camera unit is mounted on a mobile phone or the like. It can contribute to enhancing the quality of images sensed by the camera and reducing to the cost.

Although the invention made by the present inventors has been hitherto described in specific terms with reference to some of the preferred embodiments thereof, the invention is not confined to these embodiments, but various modifications are obviously possible without deviating from its true spirit and scope.

For instance, the invention is not limited to MCMs in which semiconductor chips having analog functions and semiconductor chips having high-voltage signal outputting functions are stacked one over another. It can be extensively applied to a wide variety of MCMs including MCMs in which semiconductor chips mainly comprising analog circuits and semiconductor chips mainly comprising digital circuits are separately stacked, and MCMs in which semiconductor chips having analog interfacing functions as external interfacing functions and MCMs in which semiconductor chips having digital interfacing functions as external interfacing functions are separately stacked. Therefore, the invention is not limited in application to image sensing circuits for digital still cameras and the like, but circuits for equipment control for use in communication, automobiles and printers.

We claim:
1. A semiconductor device comprising:
(a) a package substrate comprising an upper surface, a back surface opposing to the upper surface, a plurality of bonding pads formed on the upper surface, and a plurality of lands formed on the back surface;
wherein the upper surface includes pairs of first edges, and pairs of second edges intersecting with the first edges; and
wherein the plurality of bonding pads are arranged along the first and second edges;

(b) a first semiconductor chip mounted over the upper surface of the package substrate;

wherein the first semiconductor chip comprises an analog circuit, a first main surface, a first rear surface opposing to the first main surface, and a plurality of first bonding pads formed on the first main surface;

wherein the plurality of first bonding pads of the first semiconductor chip includes a plurality of bonding pads for analog signals electrically connecting with the analog circuit;

wherein the first main surface includes pairs of third edges, and pairs of fourth edges intersecting with the third edges;

wherein the plurality of bonding pads for analog signals are arranged along one of the third edges; and wherein the first semiconductor chip is mounted over the upper surface of the package substrate such that the fourth edges of the first semiconductor chip are arranged next to the second edges of the package substrate;

(c) a second semiconductor chip mounted over the first semiconductor chip;

wherein the second semiconductor chip comprises an output buffer circuit, a second main surface, a second rear surface opposing to the second main surface, and a plurality of second bonding pads formed on the second main surface;

wherein the plurality of second bonding pads of the second semiconductor chip includes a plurality of bonding pads for high-voltage signals;

wherein the second main surface includes pairs of fifth edges, and pairs of sixth edges intersecting with the fifth edges;

wherein the plurality of bonding pads for high-voltage signals are arranged along one of the sixth edges; and wherein the second semiconductor chip is mounted over the first semiconductor chip such that the sixth edges of the second semiconductor chip are arranged next to the fourth edges of the first semiconductor chip;

(d) a plurality of first bonding wires electrically connecting the plurality of first bonding pads of the first semiconductor chip with the plurality of bonding pads of the package substrate;

(e) a plurality of second bonding wires electrically connecting the plurality of second bonding pads of the second semiconductor chip with the plurality of bonding pads of the package substrate;

(f) sealing resin for sealing the first semiconductor chip, the second semiconductor chip, the plurality of first bonding wires and the plurality of second bonding wires; and (g) a plurality of external terminals formed over the plurality of lands, respectively.

2. The semiconductor device according to claim 1, wherein the plurality of bonding pads includes a plurality of first bonding pads arranged along one of the second edges, and a plurality of second bonding pads arranged along the one of the second edges;

wherein each of the plurality of second bonding pads is arranged closer to the second edges than each of the plurality of first bonding pads;

wherein the plurality of first bonding pads of the first semiconductor chip are electrically connected with the plurality of bonding pads of the package substrate via the plurality of first bonding wires such that the plurality of bonding pads for analog signals are electrically connected with the plurality of first bonding pads of the package substrate via the plurality of first bonding wires; and wherein the plurality of second bonding pads of the second semiconductor chip are electrically connected with the plurality of bonding pads of the package substrate via the plurality of second bonding wires such that the plurality of bonding pad for high-voltage signals are electrically connected with the plurality of bonding pads of the package substrate arranged along one of the first edges via the plurality of second bonding wires, and parts of the plurality of second bonding pads of the second semiconductor chip are electrically connected with the plurality of second bonding pads of the package substrate via the plurality of second bonding wires.

3. The semiconductor device according to claim 1, wherein the plurality of lands are arranged in a matrix in a plane view;

wherein the plurality of lands includes a plurality of first lands for analog signals arranged closer to the one of the second edge than other lands; and wherein the plurality of first lands are electrically connected with the plurality of first bonding pads of the package substrate via a plurality of wirings for analog signals.

4. The semiconductor device according to claim 1, wherein the plurality of first bonding pads of the first semiconductor chip includes a plurality of bonding pads for electrically connecting to the second semiconductor chip arranged along one of the fourth edges of the first semiconductor chip; and wherein the plurality of second bonding pads of the second semiconductor chip includes a plurality of bonding pads for electrically connecting to the first semiconductor chip arranged along another of the sixth edges of the second semiconductor chip;

wherein the another of the sixth edges of the second semiconductor chip is arranged next to the one of the fourth edges of the first semiconductor chip;

wherein the plurality of bonding pads for electrically connecting to the first semiconductor chip of the second semiconductor chip are electrically connected with the plurality of bonding pads for electrically connecting to the second semiconductor chip of the first semiconductor chip via a plurality of third bonding wires.

5. A semiconductor device comprising:

(a) a package substrate comprising an upper surface, a back surface opposing to the upper surface, a plurality of bonding pads formed on the upper surface, and a plurality of lands formed on the back surface;

wherein the upper surface includes pairs of first edges, and pairs of second edges intersecting with the first edges; and wherein the plurality of bonding pads are arranged along the first and second edges;

(b) a first semiconductor chip mounted over the upper surface of the package substrate;

wherein the first semiconductor chip includes an output buffer circuit, a first main surface, a first rear surface opposing to the first main surface, and a plurality of first bonding pads formed on the first main surface;

wherein the plurality of first bonding pads of the first semiconductor chip includes a plurality of bonding pads for high-voltage signals;

wherein the first main surface includes pairs of third edges, and pairs of fourth edges intersecting with the third edges;

wherein the plurality of bonding pads for high-voltage signals are arranged along one of the fourth edges; and wherein the first semiconductor chip is mounted over the upper surface of the package substrate such that the fourth edges of the first semiconductor chip are arranged next to the second edges of the first semiconductor chip;

(c) a second semiconductor chip mounted over the first semiconductor chip;

wherein the second semiconductor chip includes an analog circuit, a second main surface, a second rear surface opposing to the second main surface, and a plurality of second bonding pads formed on the second main surface;

wherein the plurality of second bonding pads of the second semiconductor chip includes a plurality of bonding pads for analog signals electrically connecting with the analog circuit;

wherein the second main surface includes pairs of fifth edges, and pairs of sixth edges intersecting with the fifth edges;

wherein the plurality of bonding pad for analog signals are arranged along one of the fifth edges; and wherein the second semiconductor chip is mounted over the first semiconductor chip such that the sixth edges of the second semiconductor chip are arranged next to the fourth edges of the first semiconductor chip;

(d) a plurality of first bonding wires electrically connecting the plurality of first bonding pads of the first semiconductor chip with the plurality of bonding pads of the package substrate;

(e) a plurality of second bonding wires electrically connecting the plurality of second bonding pads of the second semiconductor chip with the plurality of bonding pads of the package substrate;

(f) sealing resin for sealing the first semiconductor chip, the second semiconductor chip, the plurality of first bonding wires and the plurality of second bonding wires; and (g) a plurality of external terminals formed over the plurality of lands, respectively.

6. The semiconductor device according to claim 5, wherein the plurality of bonding pads includes a plurality of first bonding pads arranged along one of the second edges, and a plurality of second bonding pads arranged along the one of the second edges;

wherein each of the plurality of second bonding pads is arranged closer to the second edges than each of the plurality of first bonding pads;

wherein the plurality of first bonding pads of the first semiconductor chip are electrically connected with the plurality of bonding pads of the package substrate via the plurality of first bonding wires such that the plurality of bonding pads for high-voltage signals are electrically connected with the plurality of bonding pads of the package substrate arranged along one of the first edges via the plurality of first bonding wires, and parts of the plurality of first bonding pads of the first semiconductor chip are electrically connected with the plurality of first bonding pads of the package substrate via the plurality of first bonding wires; and wherein the plurality of second bonding pads of the second semiconductor chip are electrically connected with the plurality of bonding pads of the package substrate via the plurality of second bonding wires such that the plurality of bonding pads for analog signals are electrically connected with the plurality of second bonding pads of the package substrate via the plurality of second bonding wires.

7. The semiconductor device according to claim 5, wherein the plurality of lands are arranged in a matrix in a plane view;

wherein the plurality of lands includes a plurality of first lands for analog signals arranged closer to the one of the second edge than other lands; and wherein the plurality of first lands are electrically connected with the plurality of second bonding pads of the package substrate via a plurality of wirings for analog signals.

8. The semiconductor device according to claim 5, wherein the plurality of first bonding pads of the first semiconductor chip includes a plurality of bonding pads for electrically connecting to the second semiconductor chip arranged along another of the fourth edges of the first semiconductor chip; and wherein the plurality of second bonding pads of the second semiconductor chip includes a plurality of bonding pads for electrically connecting to the first semiconductor chip arranged along one of the sixth edges of the second semiconductor chip;

wherein the one of the sixth edges of the second semiconductor chip is arranged next to the another of the fourth edges of the first semiconductor chip; and wherein the plurality of bonding pads for electrically connecting to the first semiconductor chip of the second semiconductor chip are electrically connected with the plurality of bonding pads for electrically connecting to the second semiconductor chip of the first semiconductor chip via a plurality of third bonding wires.

* * * * *